US010043753B2

United States Patent
Cao et al.

(10) Patent No.: US 10,043,753 B2
(45) Date of Patent: Aug. 7, 2018

(54) AIRGAPS TO ISOLATE METALLIZATION FEATURES

(71) Applicant: GLOBALFOUNDRIES INC., Grand Cayman (KY)

(72) Inventors: Huy Cao, Rexford, NY (US); Zhiguo Sun, Halfmoon, NY (US); Joseph F. Shepard, Jr., Poughkeepsie, NY (US); Moosung M. Chae, Englewood Cliffs, NJ (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 0 days.

(21) Appl. No.: 15/377,592

(22) Filed: Dec. 13, 2016

(65) Prior Publication Data

US 2018/0166383 A1    Jun. 14, 2018

(51) Int. Cl.
| | |
|---|---|
| H01L 23/522 | (2006.01) |
| H01L 21/768 | (2006.01) |
| H01L 21/764 | (2006.01) |
| H01L 23/528 | (2006.01) |
| H01L 23/532 | (2006.01) |

(52) U.S. Cl.
CPC ...... H01L 23/5283 (2013.01); H01L 21/7682 (2013.01); H01L 23/5329 (2013.01)

(58) Field of Classification Search
CPC ............. H01L 23/5283; H01L 23/5329; H01L 21/7682; H01L 23/522; H01L 21/768; H01L 21/764
USPC ......................................................... 257/750
See application file for complete search history.

(56) References Cited

U.S. PATENT DOCUMENTS

| | | | |
|---|---|---|---|
| 9,330,982 B1 | 5/2016 | Cao et al. | |
| 9,455,204 B1 | 9/2016 | Cao et al. | |
| 9,640,424 B2 * | 5/2017 | Ren | H01L 21/02271 |
| 2007/0298585 A1* | 12/2007 | Lubomirsky | H01L 21/76229 438/435 |
| 2010/0248498 A1* | 9/2010 | Hetzer | H01L 21/268 438/795 |
| 2011/0221062 A1* | 9/2011 | Clevenger | H01L 21/02126 257/750 |
| 2016/0005833 A1* | 1/2016 | Collins | H01L 29/785 257/288 |

(Continued)

OTHER PUBLICATIONS

Hoofman et al., "Alternatives to Low-k nanoporous materials: dielectric air-gap integration", Solid State Technology, Aug. 2006, 4 pages.

(Continued)

*Primary Examiner* — Alexander Oscar Williams
(74) *Attorney, Agent, or Firm* — Anthony Canale; Andrew M. Calderon; Roberts Mlotkowski Safran Cole & Calderon, P.C.

(57) ABSTRACT

The present disclosure relates to semiconductor structures and, more particularly, to airgaps which isolate metal lines and methods of manufacture. The structure includes: a plurality of metal lines formed on an insulator layer; and a dielectric material completely filling a space having a first dimension between metal lines of the plurality of metal lines and providing a uniform airgap with a space having a second dimension between metal lines of the plurality of metal lines. The first dimension is larger than the second dimension.

20 Claims, 7 Drawing Sheets

(56) References Cited

U.S. PATENT DOCUMENTS

2016/0181208 A1* 6/2016 Bao .................. H01L 23/562
                                                       257/774
2017/0047242 A1* 2/2017 Sun .................. H01L 21/764

OTHER PUBLICATIONS

Shieh et al., "Air-Gap Formation During IMD Deposition to Lower Interconnect Capacitance", IEEE Electron Device Letters, vol. 19, No. 1, Jan. 1998, 3 pages.
Saraswat et al., "Low- κ Dielectrics", Department of Electrical Engineering, Stanford University, date unknown, 12 pages.
Application and Drawings for U.S. Appl. No. 15/175,187, filed Jun. 7, 2016, 26 pages.
Application and Drawings for U.S. Appl. No. 14/982,872, filed Dec. 29, 2015, 20 pages.

* cited by examiner

| UVC Temp | Post UVC | | | | WER1 100:1 dHF | | | | | WER2 100:1 dHF | | | | | WER3 100:1 dHF | | | | |
|---|---|---|---|---|---|---|---|---|---|---|---|---|---|---|---|---|---|---|---|
| | Slot | Mean | StdDev | Range | %Shrinkage | Mean | StdDev | Range | ET (sec) | ER/min | ER/sec | Mean | StdDev | Range | ET (sec) | ER/min | ER/sec | Mean | StdDev | Range | ET (sec) | ER/min | ER/sec |
| 350C | 1 | 2166 | 56.2 | 272.7 | 7.75% | 2163 | 57.2 | 277.39 | 90 | 2.000 | 0.033 | 2165 | 56.7 | 273.78 | 90 | -1.333 | -0.0222 | 2163 | 57 | 275.65 | 90 | 1.333 | 0.0222 |
| 350C | 2 | 2167 | 48.5 | 233.2 | 8.41% | 2163 | 49.1 | 236.34 | 90 | 2.66⁻ | 0.044 | 2165 | 48.9 | 235.81 | 90 | -1.333 | -0.0222 | 2163 | 49.1 | 236.64 | 90 | 1.333 | 0.0222 |
| 400C | 3 | 2171 | 56.2 | 260.0 | 10.03% | 2166 | 56.4 | 258.98 | 90 | 3.333 | 0.056 | 2169 | 56.3 | 259.71 | 90 | -2.000 | -0.0333 | 2167 | 56.3 | 259.29 | 90 | 1.333 | 0.0222 |
| 400C | 4 | 2160 | 47.3 | 222.2 | 10.63% | 2155 | 47.6 | 223.05 | 90 | 3.333 | 0.056 | 2158 | 47.3 | 222.05 | 90 | -2.000 | -0.0333 | 2156 | 47.4 | 222.8 | 90 | 1.333 | 0.0222 |
| 350C | 5 | 2513 | 37.8 | 185.3 | 6.96% | 2511 | 38.2 | 189.57 | 90 | 1.333 | 0.022 | 2510 | 37.6 | 184.96 | 90 | 0.66⁻ | 0.0111 | 2508 | 37.7 | 185.97 | 90 | 1.333 | 0.0222 |
| 350C | 6 | 2484 | 38 | 142.2 | 7.69% | 2482 | 37.3 | 140.27 | 90 | 1.333 | 0.022 | 2481 | 37.9 | 141.15 | 90 | 0.66⁻ | 0.0111 | 2479 | 37.7 | 139.9 | 90 | 1.333 | 0.0222 |

FIG. 6

AIRGAPS TO ISOLATE METALLIZATION FEATURES

FIELD OF THE INVENTION

The present disclosure relates to semiconductor structures and, more particularly, to airgaps which isolate metallization features and methods of manufacture.

BACKGROUND

The back end of line (BEOL) processes in semiconductor fabrication consist of interconnecting individual devices (e.g., transistors, capacitors, resistors, etc.) to metallization features. More specifically, BEOL typically includes the formation or deposition of contacts, insulating layers (e.g., dielectrics), metal levels, and bonding sites for chip-to-package connections.

The challenge of BEOL schemes is how to isolate metal lines from cross talk and RC delay during normal device operation, particularly in smaller technology nodes. Currently, PECVD ultra low-k dielectric (ULK) materials act as barrier to prevent EMF cross talk between metal lines. Some of the most challenging issues about using the ULK and/or nano-porous materials is that the industry is approaching the limits of creating materials for lower dielectrics (i.e., k=2.2 and lower). In fact, currently there is no stable material lower than k=2.1. And, even if it is possible to synthesize the material below k=2.2, it is very unstable, weak and prone to leakage.

SUMMARY

In an aspect of the disclosure, a structure comprises: a plurality of metal lines formed on an insulator layer; and a dielectric material completely filling a space having a first dimension between metal lines of the plurality of metal lines and providing a uniform airgap with a space having a second dimension between metal lines of the plurality of metal lines. The first dimension is larger than the second dimension.

In an aspect of the disclosure, a structure comprises a tunable low-k dielectric material which completely fills a space of a first dimension between metal lines on a substrate and which forms a uniform airgap with a space having a second dimension between other metal lines on the substrate, in a same deposition process.

In an aspect of the disclosure, a method comprises: forming metal lines on an insulator layer; and depositing a low-k dielectric material on the insulator layer between the metal lines, the depositing comprising a chemical vapor deposition capillary condensation technique which forms airgaps between metal lines that are spaced away from one another with a first dimension and a complete fill within a space of a second dimension between metal lines.

BRIEF DESCRIPTION OF THE DRAWINGS

The present disclosure is described in the detailed description which follows, in reference to the noted plurality of drawings by way of non-limiting examples of exemplary embodiments of the present disclosure.

FIG. 6 shows a wet etch rate of the low-k dielectric material using dHF.

DETAILED DESCRIPTION

The present disclosure relates to semiconductor structures and, more particularly, to airgaps which isolate metallization features (e.g., metal lines) and methods of manufacture. More specifically, the present disclosure provides low-k dielectric material which is deposited by capillary action to form airgaps which isolate metal lines. Advantageously, by using the capillary action deposition processes, low-k dielectric material exhibits superior gap fill capabilities on features that do require air gaps, as well as being well controlled and easily tunable.

In embodiments, the airgaps are formed by using chemical vapor deposition (CVD) capillary condensation techniques to create a meniscus for airgap low-k dielectric material gapfill. The CVD capillary condensation will result in an airgap between metal lines, as well as providing complete gap fill in larger features. Accordingly, the low-k dielectric material exhibits unique gapfill ability which easily performs gapfill on challenging features (e.g., larger features) and at the same time creates airgaps in smaller features. Also, by using capillary condensation techniques for low-k dielectric material deposition, the airgap can easily be controlled by tuning and modifying parameters on individual gap structures.

The structures of the present disclosure can be manufactured in a number of ways using a number of different tools. In general, though, the methodologies and tools are used to form structures with dimensions in the micrometer and nanometer scale. The methodologies, i.e., technologies, employed to manufacture the structures of the present disclosure have been adopted from integrated circuit (IC) technology. For example, the structures are built on wafers and are realized in films of material patterned by photolithographic processes on the top of a wafer. In particular, the fabrication of the structures uses three basic building blocks: (i) deposition of thin films of material on a substrate, (ii) applying a patterned mask on top of the films by photolithographic imaging, and (iii) etching the films selectively to the mask.

Figure 1:
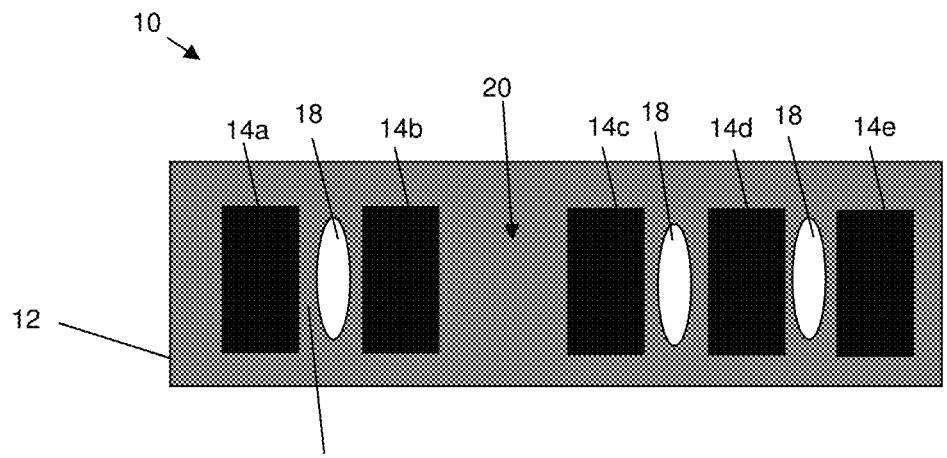
FIG. 1 shows a structure with airgaps, amongst other features, and respective fabrication processes in accordance with aspects of the present disclosure.

FIG. 1 shows a structure and respective fabrication processes in accordance with aspects of the present disclosure. As shown in FIG. 1, the structure 10 includes a plurality of metallization features 14a-14e, e.g., wiring lines, formed on insulator material 12. In embodiments, the insulator material 12 is a low-k dielectric material such as, e.g., oxide based material. The insulator material 12 can be an interlevel dielectric material.

In embodiments, the metallization features (hereinafter referred to as metal lines) 14a-14e can be formed by conventional subtractive methods. For example, a metal or metal alloy material, e.g., copper, aluminum, etc., can be blanket deposited over the insulator material 12 using any known deposition method, e.g., chemical vapor deposition (CVD) methods. A resist formed over the metal or metal alloy material is exposed to energy (light) to form a pattern (opening). An etching process with a selective chemistry, e.g., reactive ion etching (RIE), will be used to form one or more of the metallization features, e.g., metal lines 14a-14e. The resist can then be removed by a conventional oxygen ashing process or other known stripants.

Following the resist removal, a low-k dielectric material 16 can be deposited between the metal lines 14a-14e. The low-k dielectric material 16 can be deposited using capillary condensation techniques, e.g., CVD capillary condensation techniques. In embodiments, the CVD capillary condensation techniques will result in uniform airgaps 18, compared to conventional deposition methods, e.g., plasma enhanced CVD (PECVD). For example, FIG. 2 shows uniform airgaps 18.

Generally speaking, the capillary condensation deposition method will allow the low-k dielectric material 16 to form on the sidewalls of the metal lines 14a-14e. As the low-k dielectric material 16 forms on the sidewalls of the metal lines 14a-14e, it will eventually fully encapsulate air, which will form a uniform airgap 18. The encapsulation process is a combination of meniscus formation and gravity which stops the meniscus formation and traps airs when the low-k dielectric material 16 is rolled over onto the air, fully encapsulating the air and forming the airgap 18.

More specifically, capillary condensation is the process by which multilayer adsorption from a vapor into a porous medium proceeds to the point at which pore spaces become filled with condensed liquid from the vapor. The unique aspect of capillary condensation is that vapor condensation occurs below the saturation vapor pressure, Psat, of the liquid. This result is due to an increased number of van der Waals interactions between vapor phase molecules inside the confined space of a capillary. Once condensation has occurred, a meniscus immediately forms at the liquid-vapor interface which allows for equilibrium below the saturation vapor pressure. Meniscus formation is dependent on the surface tension of the material and the shape of the capillary, as shown by Young-Laplace equation. By forming the meniscus, a capillary or airgap can be formed from the meniscus, which can be precisely controlled using adhesion and cohesion of the condensation. The airgaps can take on many shapes such as tubular, oval or other shape.

Figure 2:
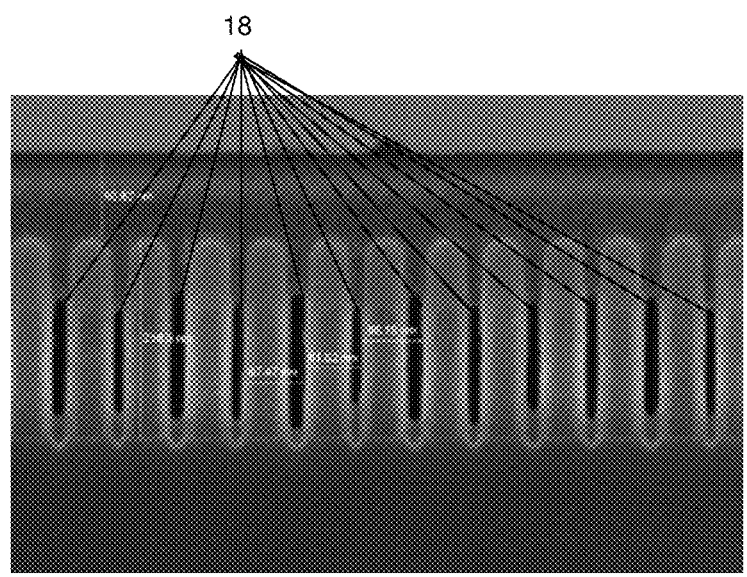
FIG. 2 shows a structure with uniform airgaps formed with gap fill material, amongst other features, and respective fabrication processes in accordance with aspects of the present disclosure.
Figure 3:
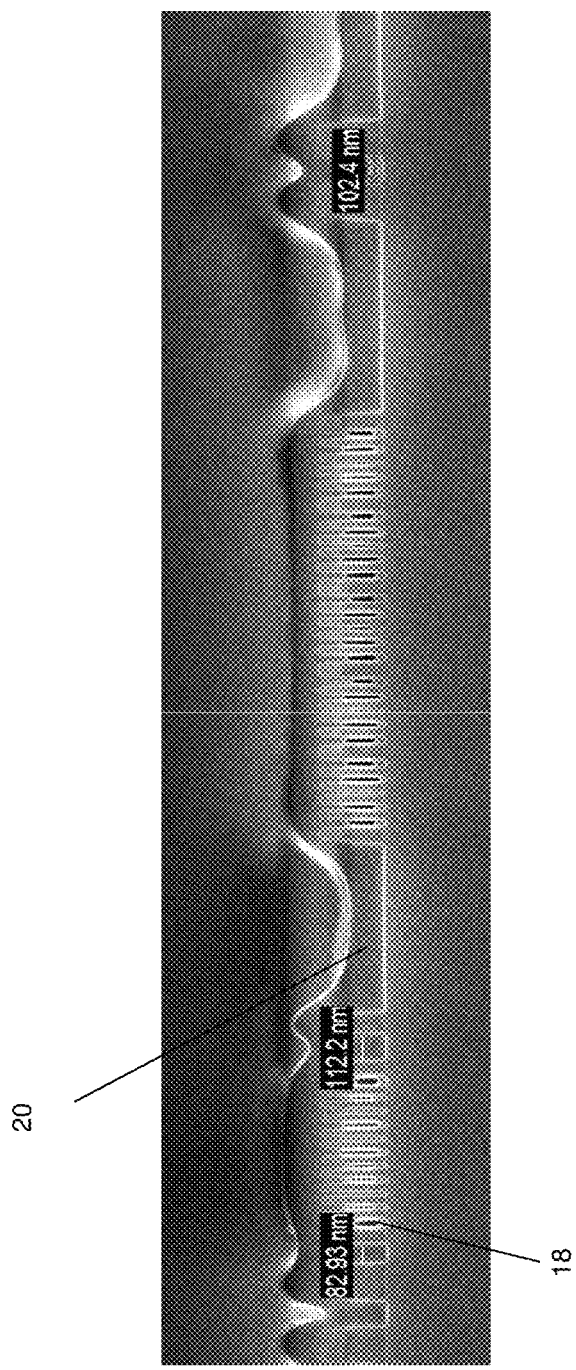
FIG. 3 shows a structure with uniform airgaps and filled gaps between metal lines, amongst other features, and respective fabrication processes in accordance with aspects of the present disclosure.

Referring to FIGS. 1 and 2, the uniform airgaps 18 are formed within smaller areas, e.g., feature size of about less than 80 nm, between metal lines 14a, 14b, metal lines 14c, 14d and metal lines 14d, 14e; whereas, the CVD capillary condensation techniques will result in complete gap fill (represented by reference numeral 20) within larger areas, e.g., feature sizes of greater than 80 nm, between metal lines 14b, 14d as shown in FIGS. 1 and 3. Accordingly, an airgap is created when the features are smaller than 80 nm and a complete gapfill for larger dimensions. In embodiments, the airgaps 18 will have a dielectric constant of k=1, compared to dielectric materials that have higher dielectric constants.

In embodiments, the low-k dielectric material 16 can have a relatively low dielectric constant, e.g., approximately 2.5-3.5; although this dielectric constant can be tuned by adjusting the ratio of the precursors forming the low-k dielectric material 16. For example, in embodiments, the low-k dielectric material 16 is preferably formed from precursors consisting of a methyl group that reacts with TMOS (Tetramethylorthosilicate) and $O_2$ to create a cross-linked low-k dielectric material when subjected to a certain temperature. More specifically, the low-k dielectric material 16 can include the following precursors (e.g., precursors are octamethylcyclotetrasilozane, TMOS and $O_2$) which are cross-linked after being subjected to a curing process, i.e.:

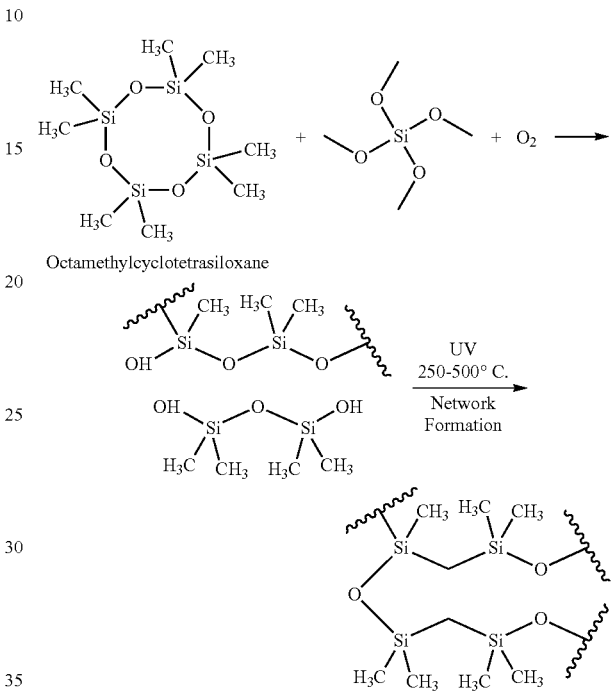

In embodiments, the curing is provided at a temperature range of about 250° C. to about 500° C. for about 2 to 10 minutes. The curing (e.g., under UV light and heat) will drive off hydrogen and moisture, and will cross-link the structure with the oxygen to form the low-k dielectric material 16. The curing process can be provided by UV radiation, as an example. The low-k dielectric material 16 is stable upwards of 550° C., with the stability being stabilized by the higher cure rates, compared to conventional ULK dielectric materials.

Figure 4:
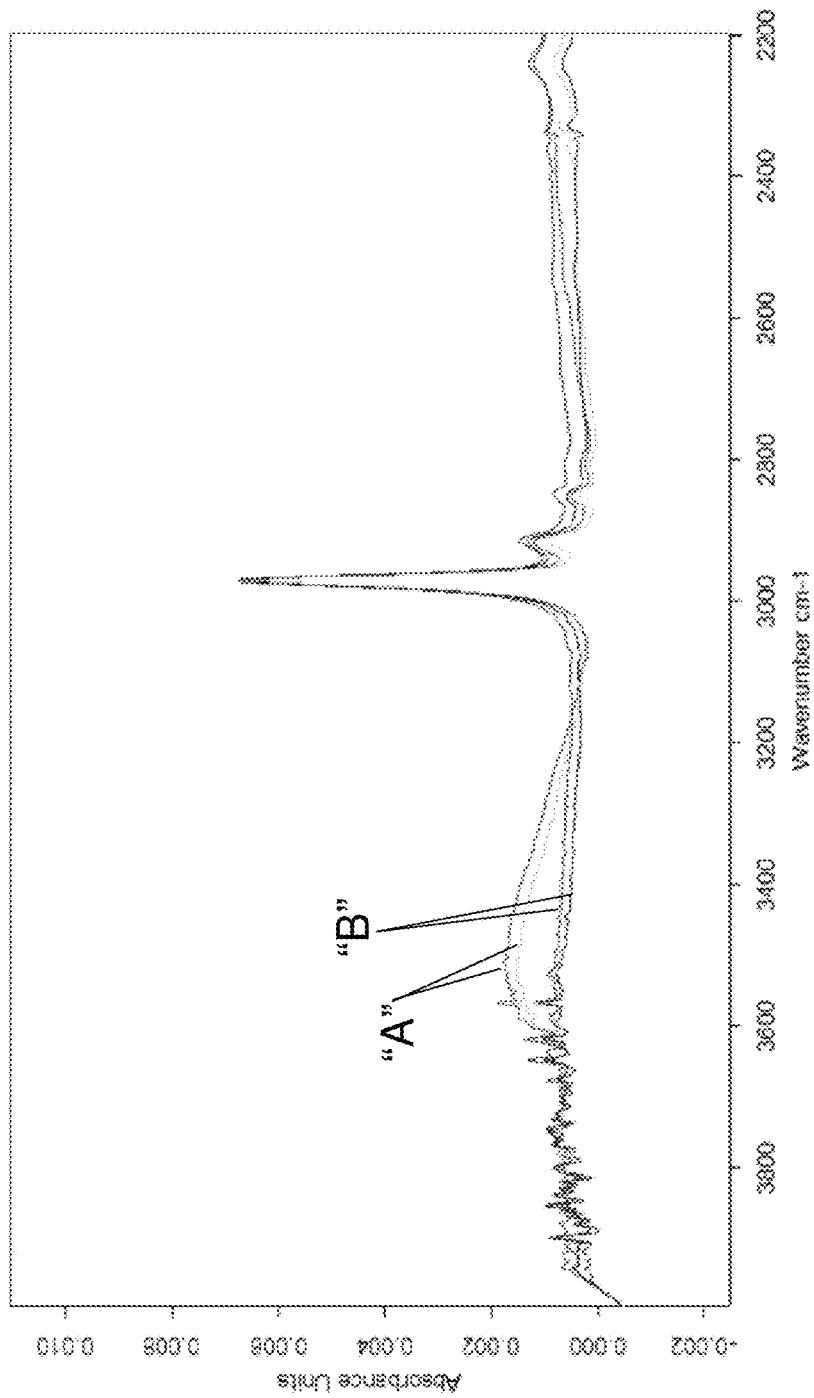
FIG. 4 shows a graph of pre and post curing of gap fill material, e.g., low-k dielectric material, in accordance with aspects of the present disclosure.

FIG. 4 shows a graph of the organic structure of the dielectric material 16 prior to curing (lines represented by "A") and after curing (lines represented by "B"), e.g., cross linked structure. As shown, in the post-cure state, e.g., after undergoing a UV treatment in a temperature range of about 250° C. to about 500° C. for about 2 to 10 minutes, water is driven off and the structure is bonded together by oxygen to have an organic cross linking with improved strength (compared to conventional ULK materials).

Moreover, in embodiments, the ratio of the precursors, e.g., methyl group that reacts with TMOS and $O_2$, can be adjusted to tune the material characteristics and flowability of the low-k dielectric material 16. For example, in one contemplated embodiment the ratio of precursors is provided at 10:1:5 resulting in a porosity of about 5 Å to 10 Å.

Figure 5:
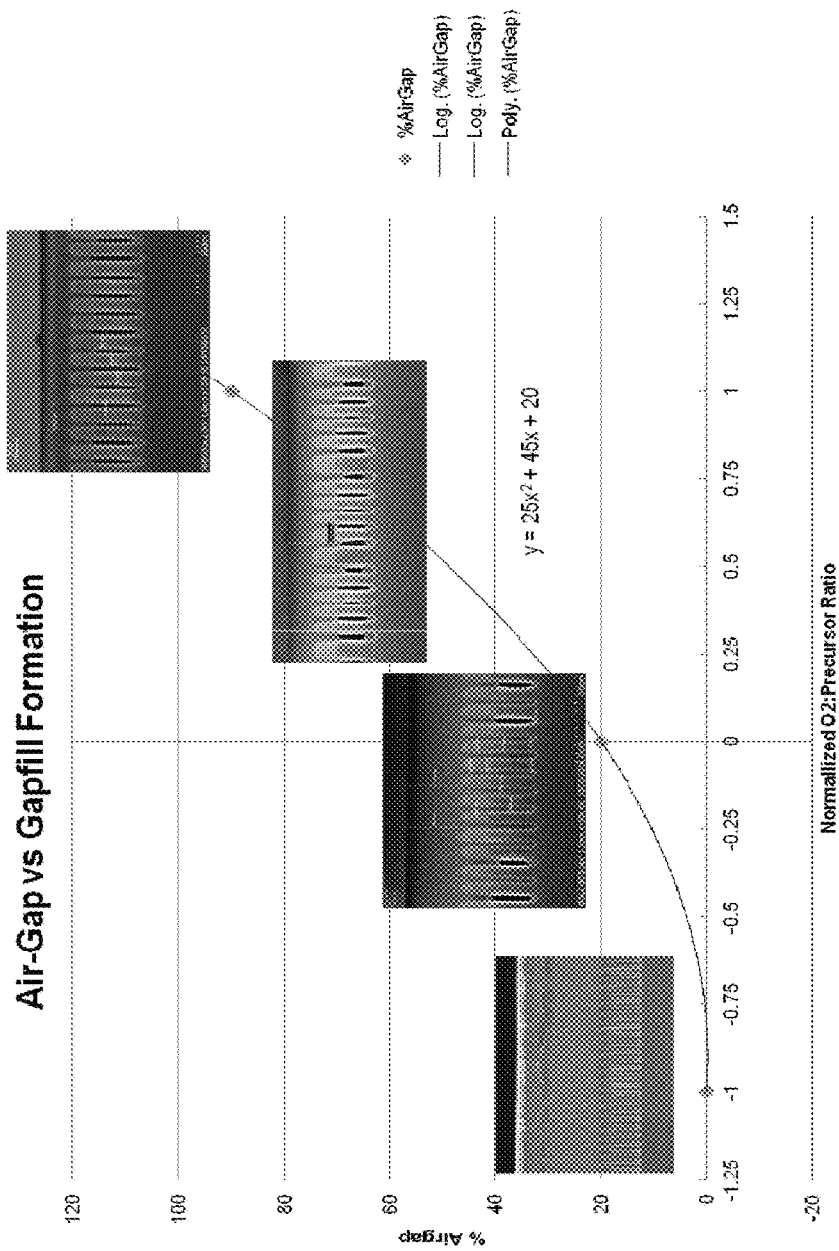
FIG. 5 shows a graph of tunability of an airgap by changing a ratio of precursor materials of gap fill material.

More specifically, as shown in FIG. 5, the airgap can be tuned by adjusting the ratio of the precursors of the low-k dielectric material 16. That is, the size of the airgap can be tuned resulting in a complete gap fill to a 100% airgap between features, or any percentage therebetween. For example, at a ratio of about 1.24 of normalized $O_2$ to precursor material (methyl group and TMOS), there is a 100% airgap between metal lines of smaller dimensions. Accordingly, it is shown that the low-k dielectric material 16 has improved controllability for airgap formation and gap fill, compared to the deposition of nano-porous materials.

In addition, the low-k dielectric material 16 (which is deposited by CVD capillary condensation techniques) provides improved mechanical properties over nano-porous materials, as well as improved Young Modulus and adhesion strength. The low-k dielectric material 16 is also highly resistive to wet etch chemistries, e.g., dHF, and provides improved removal selectivity with slurries used in chemical mechanical polishing (CMP) and RIE processes. For example, FIG. 6 shows a wet etch rate of the low-k dielectric material 16 at 100:1 dHF. In FIG. 6, the average etch rate is about 2 Å per minute, with an average etch rate at 270 seconds of about 6 Å total. The low-k dielectric material 16 also has a low etch rate in hot phosphoric acid, e.g., approximately 8.4 Å at 550° C. (UV) at five minutes. The etch selectivity of the low-k dielectric material 16 has also approximately 4× slower etch rate compared to TEOS.

FIGS. 7-11 show structures and respective fabrication processes in accordance with additional aspects of the present disclosure. For example, FIGS. 7-11 show the formation of uniform airgaps with a liner material on metallization features and low-k dielectric material used to form the airgaps, amongst other features. In embodiments, the liner material can have a tunable dielectric constant, e.g., k=4.0-4.5, and is preferably highly resistance to wet etch chemistries (i.e., DHF, Hot Phosphorous, etc. The liner material is also a dense film, compared to the low-k dielectric material.

Figure 7:
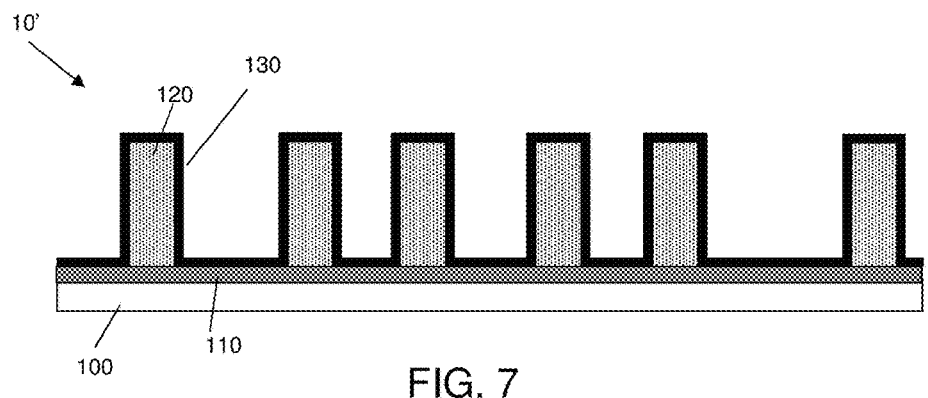
FIGS. 7-11 show structures and respective fabrication processes in accordance with additional aspects of the present disclosure.

In particular, FIG. 7 shows a structure 10' comprising a substrate 100 which comprises lower metallization layers. A dielectric material or metal layer 110 is deposited on the substrate 100 using conventional deposition processes, e.g., CVD. Pillars 120 are formed on the material 110 using conventional deposition, lithography and etching processes, e.g., RIE. In embodiments, the pillars 120 can be patterned with dimensions of subsequently formed metallization features. The pillars 120 are formed from amorphous silicon (or other selective material to the liner material and interlevel dielectric material).

Still referring to FIG. 7, a liner 130 is deposited on the pillars 120 using a conformal deposition process. For example, the liner 130 is deposited by CVD, PECVD, or inductive coupling plasma CVD (ICPCVD) processes, which provides a dense film, e.g., on the order of about 2.2 grams/cm$^3$ to about 2.7 grams/cm$^3$. The thickness of the liner 130 can be about 1 nm to 20 nm, depending on the dimensions between subsequently formed metallization features.

In embodiments, the liner 140 is a low-k dielectric material such as, e.g., SiCO or SiOC, which provides a lower k value than, e.g., SiCN or SiOCN liners. Also, in embodiments, the liner 140 can have a tunable dielectric constant of about K=4.0 to about 4.5, with a relatively good Young's Modulus which is a measure of elasticity, equal to the ratio of stress acting on a substance to the strain produced. As should thus be understood, the Young's Modulus is indirectly related to stress and adhesion of the film, which withstand such forces that the substrate will likely crack before the film delaminates, e.g., SiCO/SiOC material peels off of the substrate. The liner 130 also has high tolerance to high temperature, approximately 550° C. to about 1100° C., and has a high breakdown voltage. Moreover, in embodiments, the liner 130 is impervious to wet clean chemistries and is selective to RIE and CMP processes of other materials, thus providing protection to the airgaps 18 during subsequent fabrication processes.

Figure 8:
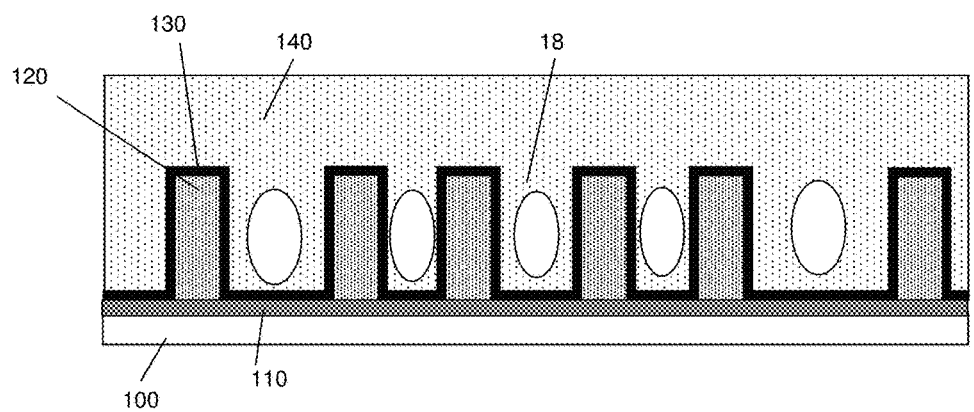

In FIG. 8, a low-k dielectric material 140 is deposited using capillary condensation techniques, e.g., CVD capillary condensation techniques. In embodiments, the CVD capillary condensation techniques will result in a porous material with uniform airgaps 18 between the liners 130. Also, the CVD capillary condensation techniques will result in a film that is less dense than the liner 135. As described in other aspects herein, the low-k dielectric material 140 can have a relatively low dielectric constant, e.g., approximately 2.5-3.5, which can be tuned by adjusting the ratio of the precursors forming the low-k dielectric material 16. For example, in embodiments, the low-k dielectric material 140 can be formed from precursors consisting of a methyl group that reacts with TMOS (Tetramethylorthosilicate) and $O_2$ to create a cross-linked low-k dielectric material when subjected to a certain temperature and conditions as already noted herein. In alternative embodiments, the low-k dielectric material 140 can be other porous materials, e.g., SiOC, SiCO or other ultra low-k dielectrics (ULK), deposited using the capillary condensation techniques. By using the capillary condensation techniques, the SiOC or SiCO or other low-k dielectrics will be a porous layer that is less dense than the liner 130.

Figure 9:
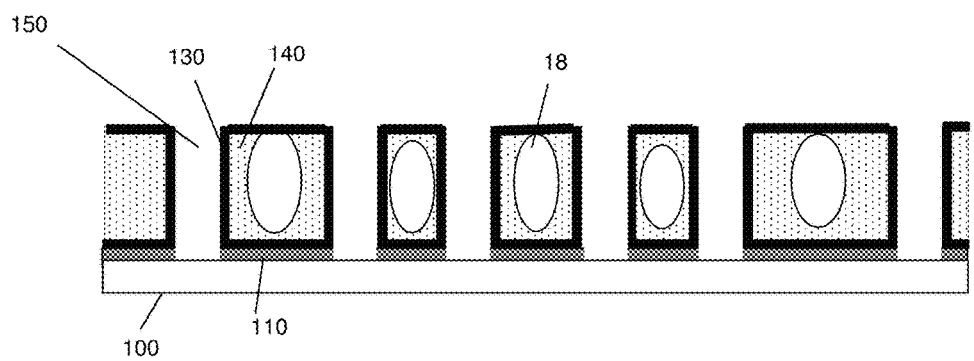

In FIG. 9, the low-k dielectric material 140 is planarized using a conventional CMP process. The liner 130 on the upper portion of the pillars 120, which becomes exposed due to the CMP process, is also removed by conventional processes, hence exposing the material of the pillars 120, e.g., amorphous silicon. The pillars 120 can then be removed through a highly selective etching process to form trenches 150, without the need for additional masking steps. As should be understood by those of ordinary skill in the art, the liner 130 is impervious to wet clean chemistries and is selective to the RIE and CMP processes, thus providing additional protection to the airgaps 18 and eliminating the need for additional masking steps.

Figure 10:
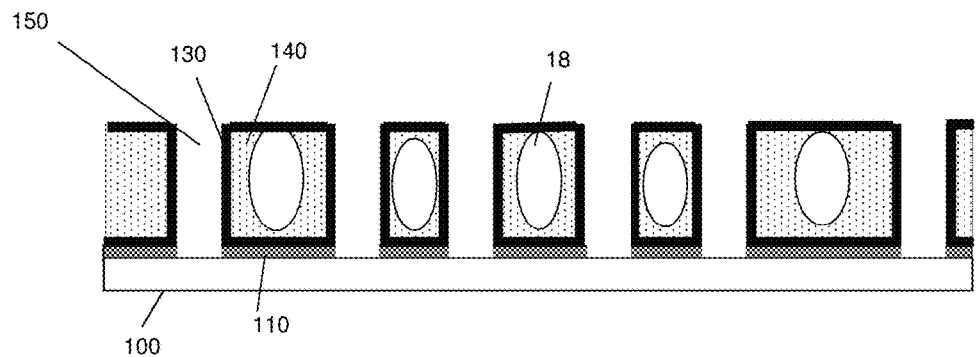

In FIG. 10, an optional capping liner 135, e.g., SiOC or SiCO, is formed over the airgaps 18, e.g., on the low-k dielectric material 140. The capping liner 135 is provided as a dense film (e.g., non-porous film), similar to that of the liner 130. In embodiments, the capping liner 135 is deposited in a non-conformal deposition process which results in a thicker layer of material at the top of the low-k dielectric material 140 than within the trenches 150. In this way, during subsequent etching steps to remove the material 110 at the bottom of the trenches 150, as shown in FIG. 10, the capping liner 135 will remain above the airgaps 18. The combination of the liner 130 and capping liner 135 will provide a hermetic seal about the airgap 18.

Figure 11:
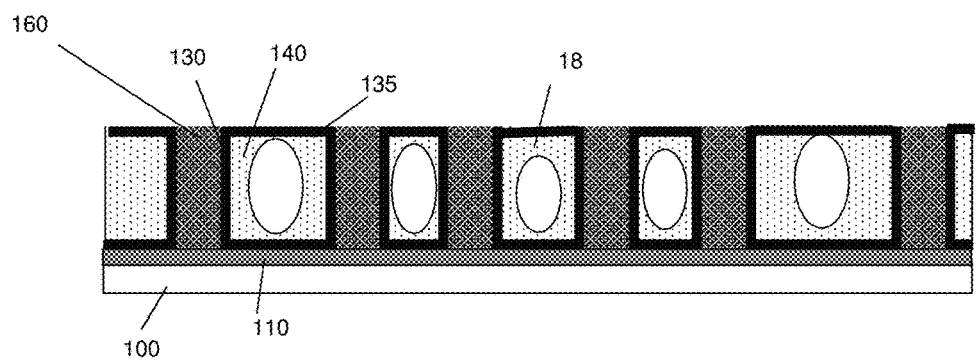

As shown in FIG. 11, a metal material 160 is deposited within the trenches. The metal material 160 can be copper, deposited by a CVD process. After deposition of the copper material, a CMP process can be performed to planarize the copper material to form metallization features. The capping liner 135 will be resistant to the CMP process of the copper material 160.

The method(s) as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The descriptions of the various embodiments of the present disclosure have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed:

1. A structure, comprising:
   a plurality of metal lines formed on an insulator layer; and
   a dielectric material completely filling a space having a first dimension between metal lines of the plurality of metal lines and providing a uniform airgap with a space having a second dimension between metal lines of the plurality of metal lines, the first dimension being larger than the second dimension.

2. The structure of claim 1, wherein the dielectric material is a low-k dielectric material.

3. The structure of claim 2, wherein the dielectric material has a dielectric constant of approximately 2.5 to 3.5.

4. The structure of claim 2, wherein the airgap is tunable by changing a ratio of precursors of the low-k dielectric material.

5. The structure of claim 2, wherein the airgap has a dielectric constant of about 1.

6. The structure of claim 2, wherein the dielectric material around the airgap is lined with a liner material that is denser than the dielectric material.

7. The structure of claim 6, wherein the dielectric material is a porous low-k dielectric material.

8. The structure of claim 7, wherein the liner material is SiCO or SiOC.

9. The structure of claim 1, wherein the dielectric material includes precursors with a ratio of 10:1:5 with a porosity of about 5 Å to 10 Å.

10. A structure comprising a tunable low-k dielectric material which completely fills a space of a first dimension between metal lines on a substrate and which forms a uniform airgap with a space having a second dimension between other metal lines on the substrate, in a same deposition process.

11. The structure of claim 10, wherein the low-k dielectric material has a dielectric constant of approximately 2.5 to 3.5.

12. The structure of claim 10, wherein the airgap is tunable by changing a ratio of precursors of the low-k dielectric material.

13. The structure of claim 12, wherein the precursors include a methyl group, TMOS and oxygen.

14. The structure of claim 10, wherein the low-k dielectric material about the airgap is lined with a liner material that is denser than the low-k dielectric material.

15. The structure of claim 13, wherein the low-k dielectric material is a porous material.

16. The structure of claim 13, wherein the precursors have a ratio of 10:1:5.

17. The structure of claim 13, wherein the low-k dielectric material has a porosity of about 5 Å to 10 Å.

18. The structure of claim 1, wherein the dielectric material fills both the space between the metal lines of the plurality of metal lines and surrounds the uniform airgap with the space between the metal lines of the plurality of metal lines.

19. The structure of claim 18, wherein the dielectric material about the airgap is lined with a liner material that is denser than the dielectric material.

20. The structure of claim 10, wherein the dielectric material includes precursors with a ratio of 10:1:5 with a porosity of about 5 Å to 10 Å.

* * * * *